United States Patent [19]

Laskaris

[11] Patent Number: 4,986,078
[45] Date of Patent: Jan. 22, 1991

[54] REFRIGERATED MR MAGNET SUPPORT SYSTEM

[75] Inventor: Evangelos T. Laskaris, Schenectady, N.Y.

[73] Assignee: General Electric Company, Schenectady, N.Y.

[21] Appl. No.: 395,637

[22] Filed: Aug. 17, 1989

[51] Int. Cl.$^5$ ............................................. F25B 19/00
[52] U.S. Cl. .................................. 62/51.1; 62/259.2; 335/216; 505/892
[58] Field of Search ................... 62/45.1, 51.1, 259.2; 335/216; 505/892

[56] References Cited

U.S. PATENT DOCUMENTS

| | | | |
|---|---|---|---|
| 4,535,595 | 8/1985 | Keller et al. | 505/892 |
| 4,655,045 | 4/1987 | Matsumoto et al. | 62/51.1 |
| 4,777,807 | 10/1988 | White | 62/51.1 |
| 4,788,834 | 12/1988 | Usui et al. | 62/51.1 |
| 4,827,736 | 5/1989 | Miura et al. | 62/51.1 |
| 4,848,103 | 7/1989 | Pelc et al. | 62/51.1 |

Primary Examiner—Ronald C. Capossela
Attorney, Agent, or Firm—Paul R. Webb, II; James C. Davis, Jr.

[57] ABSTRACT

A magnet cartridge and thermal shield are supported by three concentric nested thin wall tubes from a vacuum vessel. The innermost tube of thermal insulating material is affixed to magnet cartridge at one end and supports the first stage heat station at the other. The intermediate tube of heat conducting material transfers the load from the inner tube to the outer tube which is affixed to the vacuum vessel. The intermediate tube also thermally connects the first stage heat station to the thermal radiation shield. The outer tube also supports the thermal radiation shield. All of the tube joints rely on epoxy-bonded threads to provide good mechanical strength, low motion thermal contact resistance, and no relative motion.

5 Claims, 3 Drawing Sheets

REFRIGERATED MR MAGNET SUPPORT SYSTEM

CROSS REFERENCE TO RELATED APPLICATIONS

The present invention is related to the following copending applications: Ser. No. 07/395,635, entitled "Epoxy-Impregnated Superconductive Tape Coils"; Ser. No. 07/395,636 entitled "Refrigerated MR Magnet Support System"; and Ser. No. 07/395,634, entitled "Demountable Coil Form for Epoxy-Impregnated Coils".

BACKGROUND OF THE INVENTION

The present relates to a cryocooler interface and magnet cartridge support for magnetic resonance (MR) magnets. Magnet cartridge suspensions in MR magnets are typically made of tension members which allow motion at the attachment points to accommodate thermal contraction and expansion which is dependent on whether the magnet is being cooled down or returning to ambient conditions. Motion at the attachment points causes heating and can result in a magnet quench during current ramp up in the magnet. During a magnet quench, a portion of the magnet conductor and eventually the entire magnet ceases to be superconductive with large quantities of heat dissipated. The problem of frictional heating is of particular concern in refrigerated magnets which do not have helium to intercept and dissipate the heat generated by the sliding motion of the suspension system. In a refrigerated magnet, the heat generated by the sliding motion is carried to the magnet cartridge by the suspension and then carried by the magnet cartridge to the cryocooler. If the conductor in the magnet cartridge exceeds its critical temperature, a quench can occur and ramp up must begin again.

It is an object of the present invention to provide a strong suspension system for the magnet cartridge and thermal shield which has no sliding contacts at the interface with the magnet cartridge or the vacuum vessel.

It is a further object of the present invention to provide a suspension system for the magnet cartridge and thermal shield and provides an interface for a cryocooler which limits the conductive heat load from the vacuum vessel to the magnet cartridge.

SUMMARY OF THE INVENTION

In one aspect of the present invention a superconductive magnet cooled by a two stage cryocooler is provided including a vacuum vessel, a magnet cartridge, a thermal radiation shield and three concentric cylindrical tubes. The magnet cartridge has at least one superconductive coil and is situated in the vacuum vessel. The thermal radiation shield surrounds the magnet cartridge and is spaced way from the magnet cartridge and the vacuum vessel. A first stage heat station is provided for removably thermally engaging the first stage of the cryocooler. A second stage heat station removably engages the second stage of the cryocooler and is in thermal and supporting contact with the magnet cartridge. The three concentric cylindrical tubes include an outer tube, and intermediate tube and an inner tube. The outer tube substantially encloses the intermediate tube and the intermediate tube substantially encloses the inner tube. Each of the tubes have a first and second end. The first and second heat stations are situated inside the inner tube. The outer tube is secured to the vacuum vessel at its first end and to the thermal radioshield and the first end of the intermediate tube at its second end. The second end of the intermediate tube is secured to the first end of the inner tube. The second end of the inner tube extends through an aperture in the thermal radiation shield and is secured to the magnet cartridge. Spring bias means secured between the second end of the intermediate tube and the first stage heat station for maintaining a constant pressure between the cryocooler first stage and the first stage heat station when the second stage of the cryocooler is forced in contact with the second stage heat station. Also provided are means for thermally connecting the thermal radiation to the first stage heat station.

BRIEF DESCRIPTION OF THE DRAWING

The subject matter which is regarded as the invention, is particularly pointed out and distinctly claimed in the concluding portion of the specification. The invention, however, both as to organization and method of practice, together with further objects and advantages thereof, may best be understood by reference to the following description taken in conjunction with the accompanying drawing figures in which:

Figure 1:
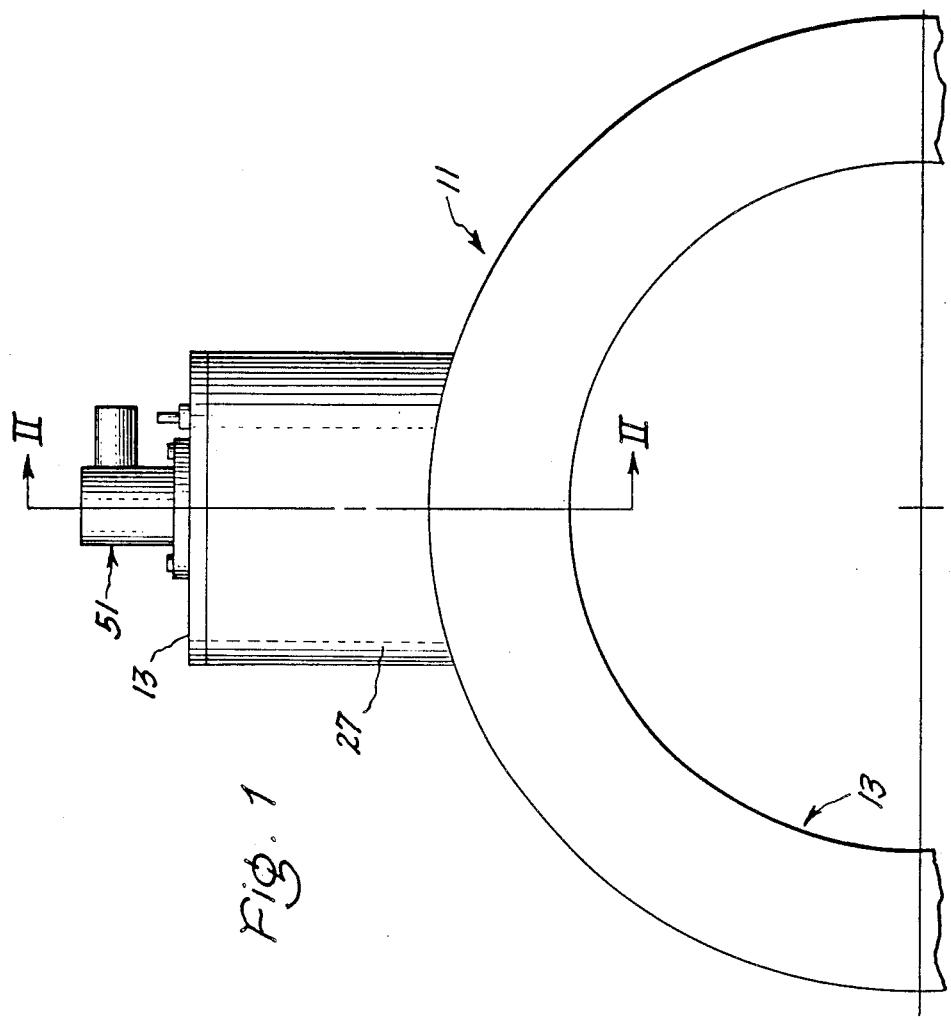
FIG. 1 is a partial end view of an MR magnet vacuum vessel cooled by a two stage cryocooler.
Figure 2:
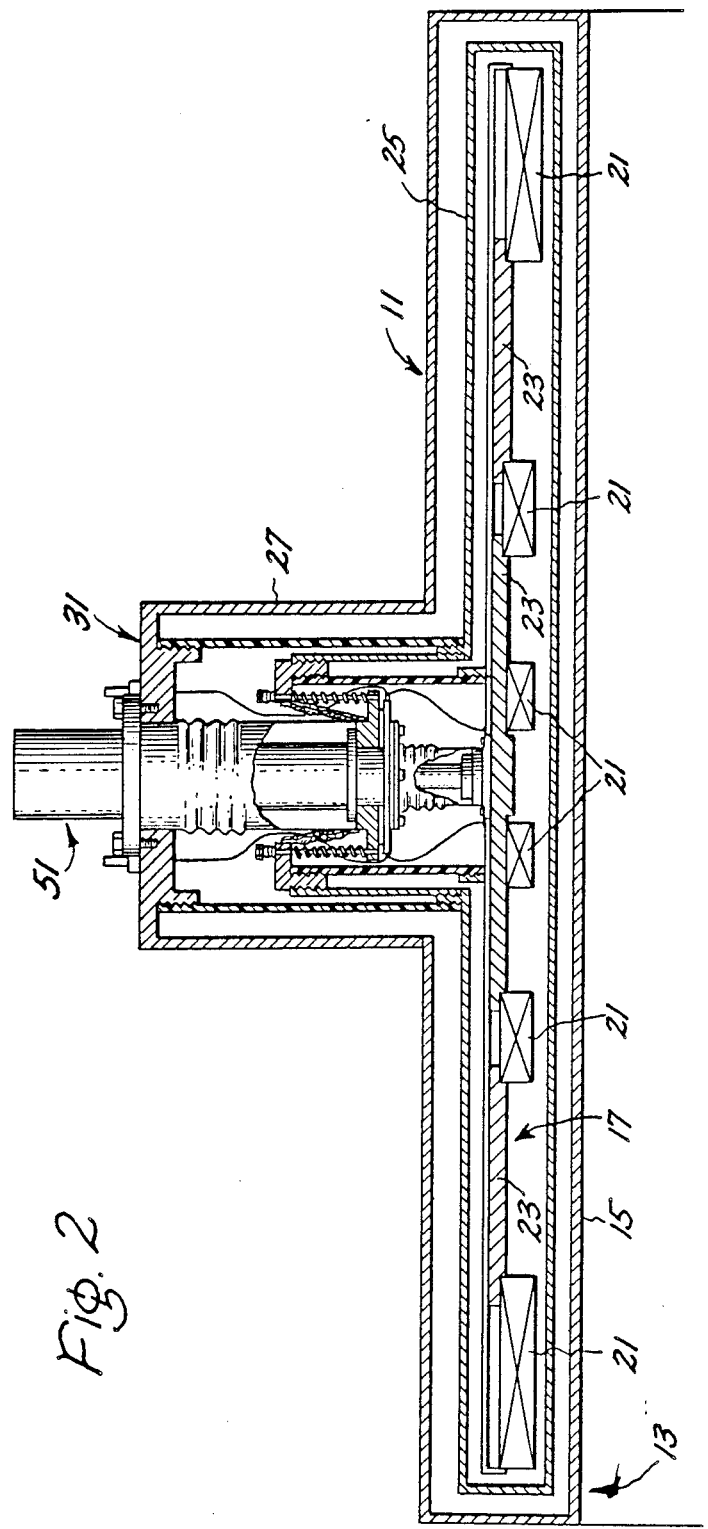
FIG. 2 is side view taken along lines II—II in FIG. 1 showing a support system for a magnet cartridge and interface for the cryocooler in accordance with the present invention situated in the vacuum vessel.
Figure 3:
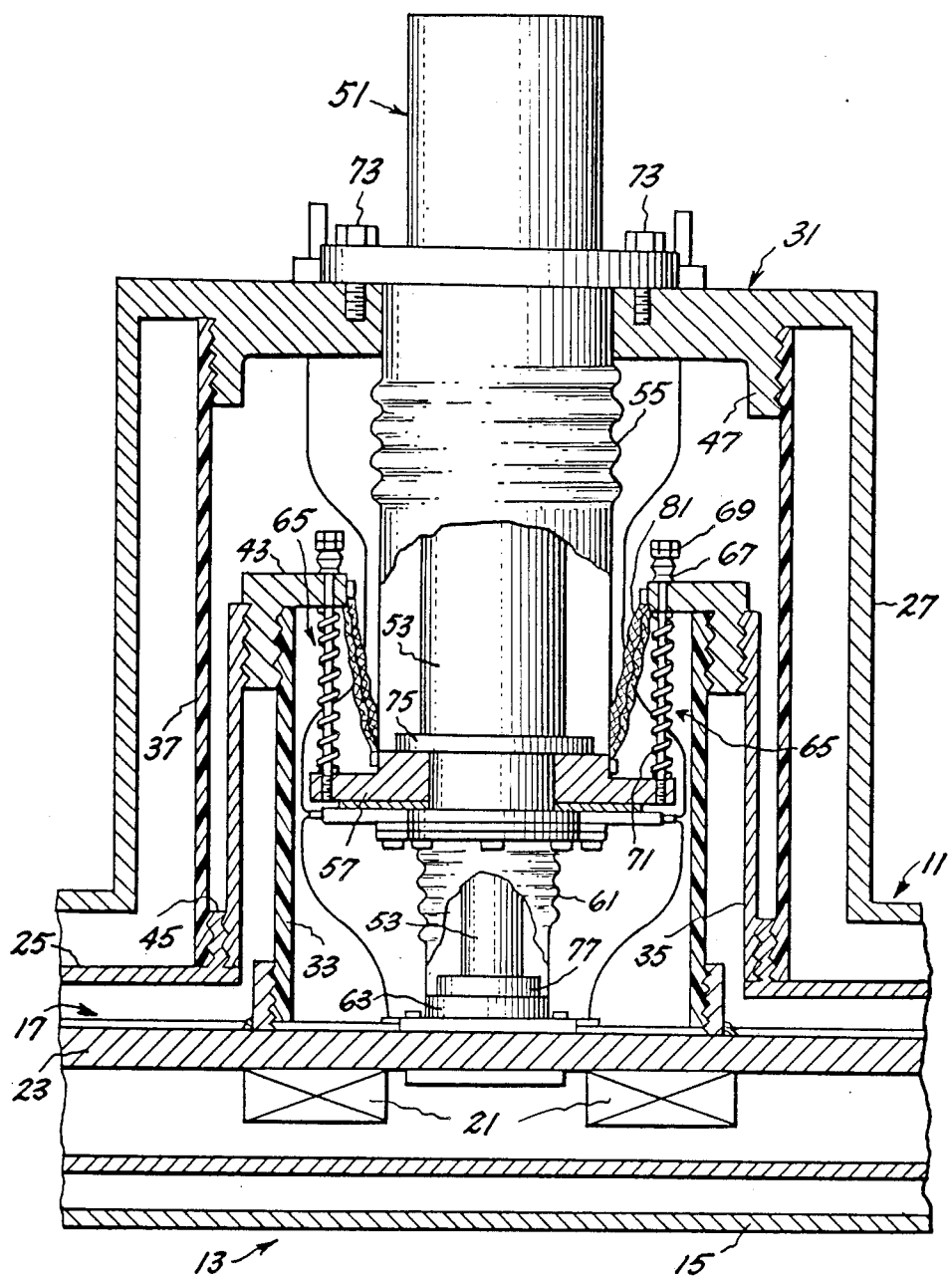
FIG. 3 is an enlarged view of the interior of the cylindrical extension of the vacuum vessel showing the support system for the magnet cartridge and for the cryocooler.

Referring now to the drawing and particularly FIG. 1 thereof, a cylindrical vacuum vessel 11 having an axially extending bore 13 is shown. The vacuum vessel can be fabricated from carbon steel with the bore sleeve 15 fabricated from stainless steel. The vacuum vessel has welded seams. A cylindrical magnet cartridge 17, which can be seen in FIG. 2, is located inside the vessel 11 and surrounds and is spaced away from the bore sleeve 15. The magnet cartridge comprises superconductive coils 21 and supports 23 to position the coils relative to one another. One type of magnet cartridge is shown in copending application Ser. No.(RD-19,495) entitled "Magnet Cartridge for Magnetic Resonance Magnet" which is hereby incorporated by reference. The magnet cartridge 17 is surrounded by a cylindrical thermal shield 25 which encloses the magnet cartridge but is spaced away therefrom most easily seen in the enlarged view of FIG. 3.

The vacuum vessel has a cylindrical extension 27 which protrudes radially outwardly from the vacuum vessel 11. The cylindrical extension has an annular shaped cover 31. The central axis of the extension lies on a radial line extending from the cylindrical vacuum vessel on the midplane of the vacuum vessel. The cylindrical extension and cover can be fabricated from carbon steel.

The magnet cartridge 17 is supported inside the vacuum vessel 11 by three concentric thin wall tubes 33, 35, and 37. The innermost tube 33 has external threads on either end and is fabricated from a material which is a good thermal insulator at cryogenic temperatures, such as G-10 epoxy resin bonded glass cloth. The innermost tube 33 is secured to the magnet cartridge by means of an internally threaded collet which is secured to the magnet cartridge. The collet 41 can be fabricated from a material such as aluminum. One end of the innermost tube is secured to the collet 41 by an epoxy-bonded threaded joint. Applying epoxy resin to the parts prior to threading them together results in a joint with good mechanical strength and no relative motion. The epoxy bonded threaded joint also results in a low thermal contact resistance which is useful when the sleeve is providing thermal coupling between two components.

The other end of the innermost tube is epoxy-bonded threaded in a collet 43 which has interior and exterior threads and an inwardly extending flange.

The intermediate tube 35 has internal threads on one end and external threads on the other and is fabricated from a high thermal conductivity material such as aluminum. The end of the tube with the internal threads forms an epoxy-bonded threaded joint with the exterior threads of collet 43. The externally threaded end of the intermediate tube 35 is connected to a ring 45 having internal and external threads and secured to thermal shield 25. The ring surrounds an opening in the thermal shield. The ring 45 and thermal shield 25 can be fabricated from aluminum, for example, and welded together.

The annular cover plate 31 closing off the cylindrical vacuum vessel extension includes a threaded nipple portion 47 on the inner surface of the cover. The threaded nipple and ring 45 are of the same diameter and are concentric with one another. The outer tube 37 is fabricated from a thermally insulating material such as G-10 and is joined between the external threads of the ring and the nipple by epoxy-bonded threaded joints.

A two stage cryocooler 51 is mounted through the cover 31 and the cryocooler cold end 53 extends through the aperture into a separate vacuum enclosure defined by a first flexible bellows 55 of low thermal conductivity material welded to the annular opening of the cover 31 at one end and to a shoulder on a ring shaped first stage copper heat station 57 at the other. A second flexible bellows 61, also a part of the separate vacuum enclosure, which can also be fabricated from stainless steel, encloses the area between the first stage heat station 57 and a second stage heat station 63. The separate vacuum enclosure extends through an opening in the thermal shield with the second stage heat station 63 in contact with the magnet cartridge 17. The first stage heat station 57 which comprises a ring of high thermal conductivity material such as copper is supported from a flange portion of collet 43 by a plurality of circumferentially spaced spring loaded threaded rods 65. Each of the rods threadingly engage the first stage heat station 57 on one end and extend through a hole in the flange on collet 43 on the other. The portion of the rod extending through the flange on collet 43 is surrounded by Belleville washers 67 and secured in place by a nut 69. The spring 71 captured between the flange and ring and encircling the rod helps maintain the first stage heat station 57 position if the cold head 53 of the cryocooler is withdrawn. As bolts 73 securing the cryocooler 51 to the annular cover 31 are tightened, the first stage 75 of the cold end of the cryocooler pushes against the first stage heat station 57 which creates tension in rods by compressing the Belleville washers 67. The Belleville washers are stacked to create the desired interface pressure between the first stage heat station and the first stage of the cryocooler over a predetermined travel distance.

As the Belleville washers compress, the second stage 77 of the cold end contacts the second stage heat station 63. Thin sheets of a soft pure metal such as silver or indium can be used at the interface between the cryocooler stages and the heat stations. In the present embodiment thin sheets of indium foil, 0.005 inches thick are used between the first cryocooler stage heat station and the first stage heat exchanger as well as between the second cryocooler stage and the second stage heat exchanger to provide low thermal contact resistance.

The first stage heat station is thermally connected to the flange of collet 43 by copper braids 81 which are welded or brazed, and bolted in place. The braids 81 allow for movement between the flange and the first stage heat station.

The suspension system in addition to supporting the weight of the magnet cartridge must support the load imposed by the first and second stages of the cryocooler cold end pressing down on the first and second stage heat stations 57 and 63, respectively. The magnet cartridge is supported close to where the load is imposed by the end of the cryocooler, reducing bending stresses on the magnet cartridge. The inner tube 33, which is under tension, in addition to transferring the load of the magnet cartridge weight, as well as the force exerted on the magnet cartridge by the second stage cold end of the cryocooler, thermally insulates the magnet cartridge from the thermal radiation shield 25. The magnet cartridge and thermal radiation shield can operate at 10K and 80K, respectively.

The aluminum intermediate tube 35 which is subjected to a compressive load, in addition to transferring the load from the inner tube 33 to the ring 45 also transmits the load of the first stage of the cryocooler on the first stage heat station 57. The intermediate tube 35 thermally couples the heat shield 25 to the first stage of the cryocooler 75.

The outside tube 37 thermally insulates the thermal radiation shield 27 from the vacuum vessel 27 and transfers the load of the cryocooler interface, magnet cartridge, and shield to the vacuum vessel.

In a MR magnet having a 1200 pound magnet cartridge, a 300 pound thermal radiation shield and a 1000 pound load at each of the cryocooler heat stations, and inner and outer G-10 tube with a 0.125 inch and a 0.2 inch wall thickness and an intermediate aluminum tube with a 0.2 inch thickness, there is provided a suspension system which is sufficiently strong to withstand lateral, torsional, and axial loads during transportation of the magnet. Motion of the magnet cartridge is restrained by the epoxy bonded threaded joints used in connecting the tubes to one another.

The electrical leads are heat stationed as claimed and described in U.S. Pat. No. 4,876,413, filed July 5, 1988 entitled "Efficient Thermal Joints for Connecting Current Leads to a Cryocooler", and hereby incorporated by reference.

The foregoing has described a refrigerated MR magnet support system that has no sliding contacts at the interface with magnet cartridge or the vacuum vessel.

While the invention has been particularly shown and described with reference to an embodiment thereof, it will be understood by those skilled in the art that various changes in form and detail may be made without departing from the spirit and scope of the invention.

What is claimed is:

1. A superconductive magnet cooled by a two stage cryocooler comprising:
   a vacuum vessel;
   a magnet cartridge having at least one superconductive coil situated in the vacuum vessel;
   a first stage heat station for removably thermally engaging the first stage of the cryocooler;
   removably thermally engaging the second stage of the cryocooler, said second stage heat station in thermal and supporting contact with said magnet cartridge;
   a thermal radiation shield surrounding said magnet cartridge, said shield spaced away from said vacuum vessel and the magnet cartridge said thermal radiation shield defining an aperture;
three concentric cylindrical tubes including an outer tube, an intermediate tube and an inner tube, said outer tube substantially enclosing said intermediate tue, said intermediate tube substantially enclosing said inner tube, each of said tubes having a first and second ends, said first and second heat stations situated inside said inner tube, said outer tube secured to said vacuum vessel at its first end and to said thermal radiation shield and first end of said intermediate tube at its second end, the second end of said intermediate tube being secured to the first end of said inner tube, the second end of said inner tube extending through the aperture in said thermal radiation shield and secured to said magnet cartridge;
   spring bias means secured between second end of said intermediate tube and said first stage heat station for maintaining a constant pressure between the cryocooler first stage and the first stage heat station when the second stage of said cryocooler is forced in contact with the second stage heat station; and
   means for thermally connecting said thermal radiation shield to said first stage heat station.

2. The superconductive magnet of claim 1 wherein said outer and inner tubes are fabricated from thermally insulating material and said intermediate tube is fabricated from thermally conductive material, said means for thermally connecting said thermal radiation shield to said first stage heat station comprises said thermally conductive intermediate tube in thermal contact with said radiation shield and means for thermally connecting said second end of said intermediate shield to said first stage heat station.

3. The superconductive magnet of claim 1 wherein said first and second ends of three tubes are threaded and all connections are made by epoxy bonded joints.

4. The superconductive magnets of claim 1 wherein said spring bias means comprises stacked Belleville washers compressed to provide constant force.

5. The superconductive magnet of claim 1 further comprising a separate vacuum enclosure including a first and second flexible wall tube, said first flexible tubes connected between the vacuum vessel and the first stage heat station, said second flexible tube connecting the first stage heat station to the second stage heat station closing off the end of the tube, said cryocooler introduceable into the vacuum vessel inside of the separate vacuum enclosure.

* * * * *